(12) United States Patent
Meadowcroft et al.

(10) Patent No.: US 9,059,154 B2
(45) Date of Patent: Jun. 16, 2015

(54) LEADFRAME POCKET

(71) Applicant: Avago Technologies General IP (Singapore) Pte. Ltd., Singapore (SG)

(72) Inventors: David Meadowcroft, San Jose, CA (US); Seng-Kum Chan, Santa Clara, CA (US); Matt Murphy, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/932,756

(22) Filed: Jul. 1, 2013

(65) Prior Publication Data

US 2015/0001693 A1    Jan. 1, 2015

(51) Int. Cl.
*H01L 23/495* (2006.01)
*H01L 25/16* (2006.01)
*H01L 23/34* (2006.01)

(52) U.S. Cl.
CPC .......... *H01L 23/49568* (2013.01); *H01L 23/34* (2013.01); *H01L 25/167* (2013.01)

(58) Field of Classification Search
CPC .................................................. H01L 21/67144
USPC .................................................. 257/666–668
See application file for complete search history.

(56) References Cited

U.S. PATENT DOCUMENTS

| 5,986,885 | A | 11/1999 | Wyland | |
|---|---|---|---|---|
| 2006/0027479 | A1* | 2/2006 | Auburger et al. | 206/497 |
| 2010/0202732 | A1* | 8/2010 | Sameshima et al. | 385/39 |
| 2013/0299589 | A1* | 11/2013 | Finn | 235/488 |

OTHER PUBLICATIONS

Na Wang, (2009). "A PCB-based package structure." Technology & High Density Packaging, ICEPT-HDP, Beijing, China, 4 pages.

* cited by examiner

*Primary Examiner* — Mamadou Diallo

(57) ABSTRACT

A package structure and methods of manufacturing the same are disclosed. The package structure corresponds, in one example, to a transceiver module having a substrate with a pocket formed therein. The pocket is configured to receive one or multiple parts of a leadframe and helps reduce the amount of wire bonding required to connect the leadframe or components mounted thereon to traces on the substrate.

20 Claims, 5 Drawing Sheets

LEADFRAME POCKET

FIELD OF THE DISCLOSURE

The present disclosure is generally directed toward package structures and specifically directed toward package structures using a Printed Circuit Board (PCB) as a carrier substrate as well as methods of manufacturing the same.

BACKGROUND

Electronic devices inherently produce heat during operation. Especially in optical transceivers where higher operational frequencies are desired, the amount of heat produced in the electrical components is ever increasing. For instance, an optical transceiver configured to operate at one rate consumes approximately three times more power than an optical transceiver configured to operate at half the rate and, therefore, inherently produces approximately three times more heat.

Package structures for such optical transceivers, and other electronic modules, need to be constructed to manage this additional heat production. Unfortunately, the electrical components that produce this heat are also prone to failure when subjected to the increased heat. Accordingly, package structures for these electronic modules need to adapt as processing speeds increase.

BRIEF DESCRIPTION OF THE DRAWINGS

The present disclosure is described in conjunction with the appended figures.

DETAILED DESCRIPTION

Figure 1:
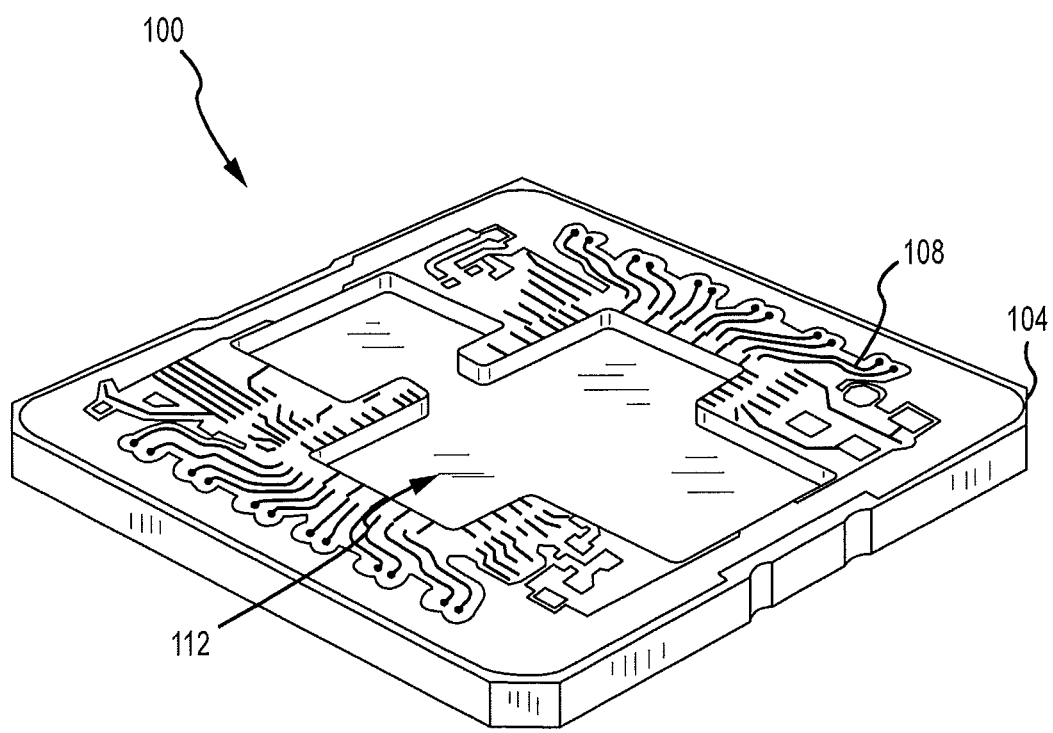
FIG. 1 is a perspective view of a package structure in a first phase of manufacturing in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

In one aspect of the present disclosure, a package structure and methods of manufacturing the same are provided. In particular, a package structure, such as a transceiver module, is disclosed as including a substrate having a first major surface and an opposing second major surface. Traces and/or electrical bonding pads may be provided on one or both of the first and second major surfaces. One of the first and second major surfaces may also comprise a pocket formed therein. The pocket, in some embodiments, does not extend all the way through the substrate; thus, the pocket is configured as a recess or depression in the substrate rather than a complete via or hole through the substrate. The pocket may also be configured to receive one or multiple sections of a leadframe. The leadframe may be configured to support one or more transceiver components such as Integrated Circuits (ICs), semiconductor chips, optical components (e.g., a vertical-cavity surface-emitting laser (VCSEL), a laser diode, a Light Emitting Diode (LED), an array of LEDs, a photodiode, a photosensor, combinations thereof, or the like), and so on. In addition to physically supporting the one or more transceiver components, the leadframe sections may also operate as heat sinks for the components by carrying heat away from the transceiver components.

While embodiments of the present disclosure will be described in connection with a transceiver module as an example of a package structure, it should be appreciated that embodiments of the present disclosure are not so limited. Instead, those of ordinary skill in the art will appreciate that any type of package structure, which may or may not include a semiconductor component, may benefit from embodiments of the present disclosure.

With reference simultaneously to FIGS. 1-5 an illustrative package structure 100 and methods of manufacturing the same will be described. In a first phase of manufacturing, a package structure 100 may comprise a substrate 104 (step 504). The substrate 104, when received, may or may not have a pocket 112 already established therein (step 508). If the substrate 104 is received without a pocket 112, then a process of establishing the pocket 112 within the substrate 104 may be performed. In particular, the substrate 104 may comprise a first major surface and a second major surface that opposes the first major surface. Conductive traces and/or bonding pads 108 may be established on one or both of the first and second major surfaces of the substrate 104. Thus, in some embodiments, the substrate 104 may correspond to a Printed Circuit Board (PCB) or the like. More specifically, the substrate 104 may be flexible or rigid in nature. In some embodiments, the substrate 104 may comprise FR-4, tape, plastic, and/or a cyanate ester substrate. In other words, any type of material known to be used as a base support layer in semiconductor packages may be utilized as the substrate 104 without departing from the scope of the present disclosure.

The substrate 104 may also have one or more conductive vias established therethrough that electrically connect the traces and/or bonding pads 108 on one major surface to traces and/or bonding pads 108 on the opposing major surface of the substrate 104. The feature of conductive vias, however, is not required. The substrate 104 may also comprise a plurality of connectors (e.g., a Ball Grid Array (BGA), a Land Grid Array (LGA), etc.) on one or both of its major surfaces. In the example shown, the substrate 104 comprises a plurality of traces and bonding pads 108 on a first major surface (e.g., a top surface of the substrate) as well as the pocket 112 on the first major surface. The depicted substrate 104 further comprises an LGA on its second major surface.

The pocket 112 may be established in the substrate 104 using any number of potential processes. For instance, the pocket 112 could be milled out of the substrate 104. As another example, the substrate 104 may comprise a plurality of layers that are formed one on top of the other and the pocket 112 may be positively formed by not adding layers of the substrate 104 at certain points during the manufacture of the substrate 104.

In some embodiments, the substrate 104 comprises a thickness (e.g., linear distance between the first major surface and second major surface) of approximately 1.0 mils to approximately 3.0 mils, or more specifically a thickness of approximately 2.0 mils. The pocket 112 may be formed to have a thickness of approximately 0.7 mils to 1.0 mils. In some embodiments, the pocket 112 may comprise a flat bottom surface that is configured to uniformly support a flat leadframe. In some embodiments, the bottom surface of the pocket 112 may be of the same material as the substrate 104 (e.g., plastic, FR-4, etc.). In some embodiments, the bottom surface of the pocket 112 may comprise a thin layer, strip, or plate of copper or a combination of copper, gold, and/or nickel so that a leadframe can be soldered to the bottom surface of the pocket 112. The thin layer, strip, or plate may cover the entire bottom surface of the pocket 112 or just portions thereof. Alternatively or additionally, the bottom surface of the pocket 112 may comprise an epoxy (e.g., a silver epoxy), an adhesive (e.g., a UV-curable adhesive, a thermosetting adhesive, etc.), or the like that enables an adhesive connection to be created between the bottom surface of the pocket 112 and a leadframe. As can be appreciated, the bottom surface of the pocket 112 may be treated in any number of ways to facilitate a proper physical connection between the pocket 112 and a leadframe contained therein.

Although the pocket 112 is depicted as not extending entirely through the substrate and, therefore, comprising a bottom surface, it should be appreciated that embodiments of the present disclosure are not so limited. In particular, the pocket 112 may extend entirely through the substrate 104 and other mechanisms may be used to physically support or maintain a leadframe in the pocket 112.

Figure 2:
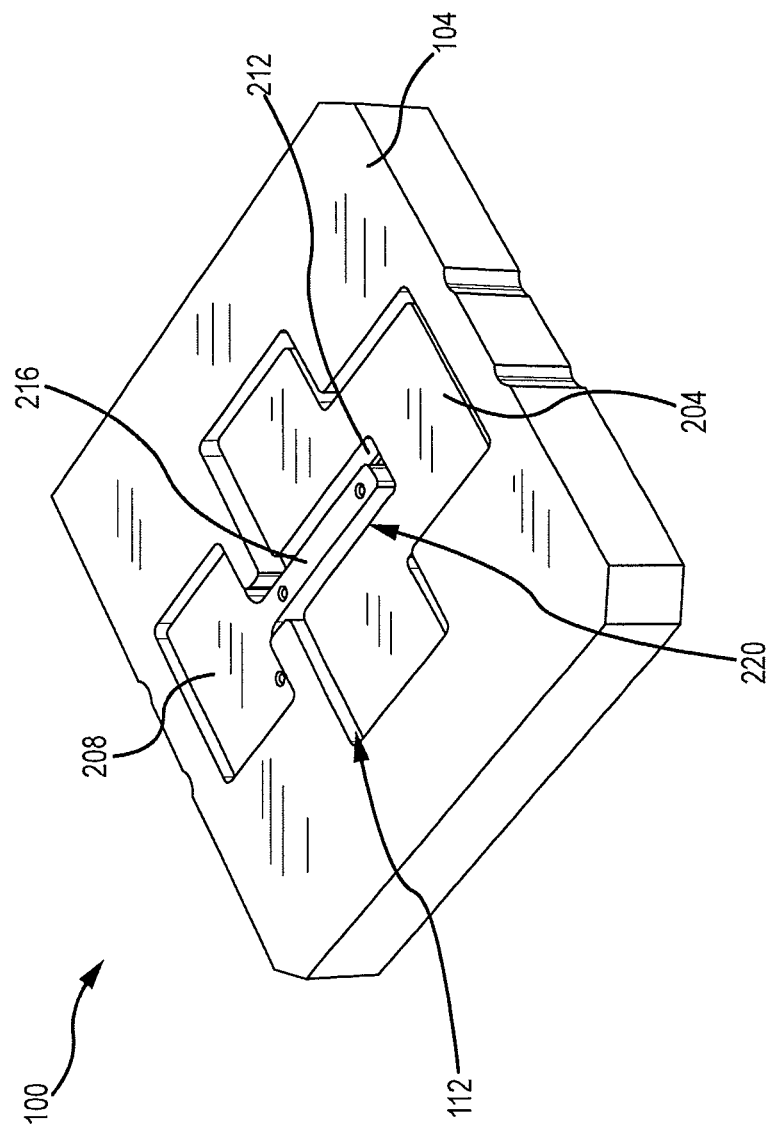
FIG. 2 is a perspective view of a package structure in a second phase of manufacturing in accordance with embodiments of the present disclosure.

As can be seen in FIG. 2, after the pocket 112 has been established in the substrate 104, one or more sections of a leadframe 204, 208 may be placed into the pocket 112 (step 512). In the depicted embodiment, the leadframe comprises a first leadframe section 204 and a second leadframe section 208. The first and second leadframe sections 204, 208 may comprise a particular shape to accommodate the optical and/or electrical components of the transceiver module to be installed later. More specifically, the first leadframe section 204 may comprise a plurality of heat removal areas (e.g., the larger surfaces) with a female portion 212 therebetween. The second leadframe section 208 may comprise one or more heat removal areas as well in addition to a male portion 216. In some embodiments, the female portion 212 of the first leadframe section 204 is configured to receive or contour with the male portion 216 of the second leadframe section 208. However, a gap 220 may be maintained between the leadframe sections 204, 208 thereby creating a thermally-split leadframe. A thermally-split leadframe may be particularly useful for situations where some optical and/or electrical components are more thermally sensitive as compared to other optical and/or electrical components. The thermally-split leadframe allows the more thermally sensitive components to be mounted to one of the sections whereas other less thermally sensitive components can be mounted to the other section. The male portion 216 inserts into the female portion 212, however, to ensure that the optical and/or electrical components are physically close to one another, thereby reducing noise, overall size of the structure 100, and material costs.

In some embodiments, one or more of the heat removal areas on the first leadframe section 204 may be configured to have one or more electrical and/or optical components mounted thereto whereas others of the heat removal areas may be designated to remain exposed, thereby increasing the first leadframe section's 204 ability to remove heat from the electrical and/or optical components.

Figure 3:
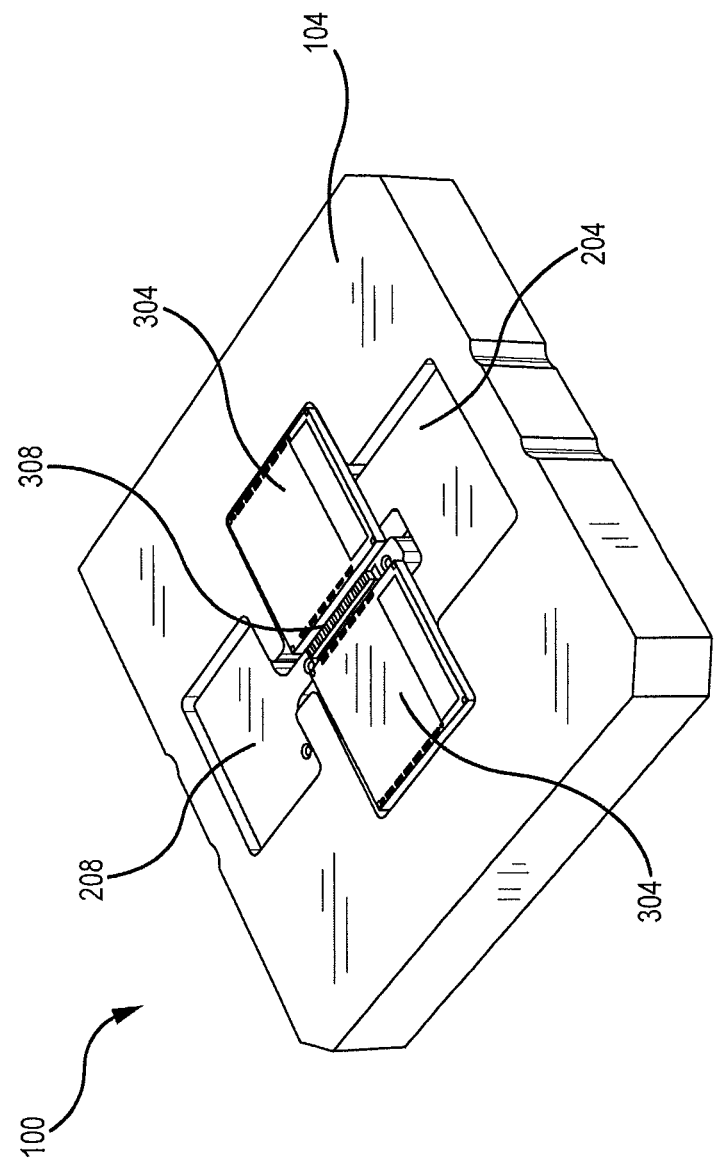
FIG. 3 is a perspective view of a package structure in a third phase of manufacturing in accordance with embodiments of the present disclosure.

Specifically, as can be seen in FIG. 3, after or simultaneous with placing the leadframe into the pocket, one or more electrical components may be established on the leadframe (step 516). In some embodiments, one, two, three or more chips 304 are mounted on the first leadframe section 204 and one or more optical components 308 are mounted on the second leadframe section 208. More specifically, the chips 304 may correspond to IC chips, microprocessors, or any other semiconductor device or collection of semiconductor devices. The chips 304 may be mounted on some, but not all, of the exposed areas of the top surface of the first leadframe section 204.

The optical components 308 may correspond to one or more of a VCSEL, a laser diode, an LED, an array of LEDs, a photodiode, a photosensor, or combinations thereof and may be mounted to the male portion 216 of the second leadframe section 208. Thus, the optical component(s) 308 may be mounted on the leadframe such that they are positioned between the chips 304, which are mounted on the first leadframe section 204.

In some embodiments, the optical component(s) 308 may be more or less sensitive to heat than the chips 304. Specifically, the optical component(s) 308 may comprise a lower maximum operating temperature than the chips 304. As an example, the optical component(s) 308 may be configured to operate at no more than 70 to 75 degrees Celsius, whereas the chips 404 may be configured to operate at nor more than 95 to 100 degrees Celsius. Thus, the second leadframe section 208 may be used to carry heat away from the optical component(s) 308 while the first leadframe section 204 may be used to carry heat away from the chips 304.

Figure 4:
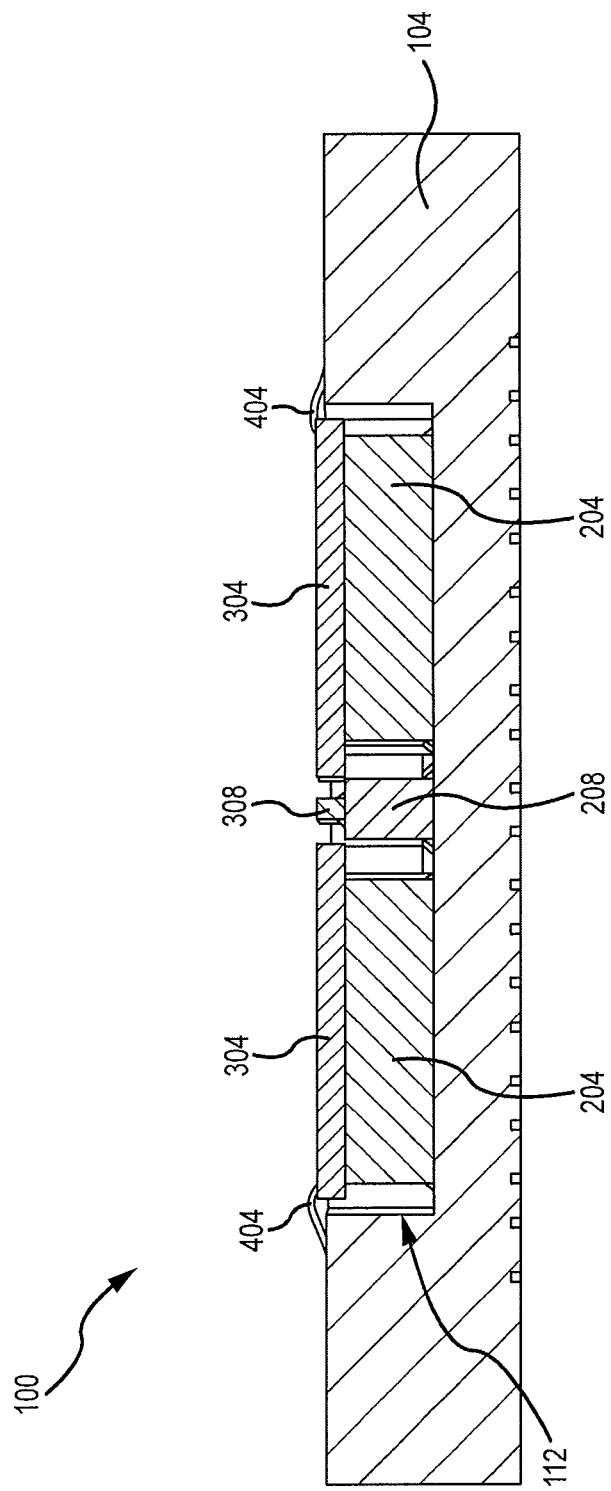
FIG. 4 is a cross-sectional view of a package structure in a fourth phase of manufacturing in accordance with embodiments of the present disclosure.
Figure 5:
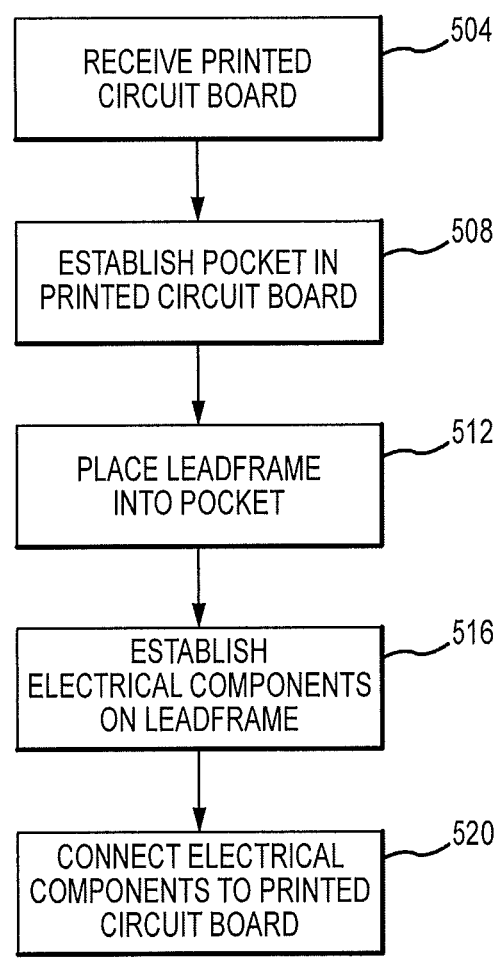
FIG. 5 is a flow diagram depicting a method of manufacturing a package structure in accordance with embodiments of the present disclosure.

As can be seen in FIG. 4, after the electrical and/or optical components are established on the leadframe sections 204, 208, the chips 304 and/or optical components 308 may be electrically connected to one or more of the traces 108 on the top surface of the substrate 104 via one or more bonding wires 404 (step 520). This enables the chips 304 and optical components 308 to begin operating in connection with additional circuitry included on the substrate 104 and/or connected to the traces 108 of the substrate 104 via some other electrical connections.

Once the wires 404 are established between the substrate 104 and one or both of the chips 304 and optical components 308, the package structure 100 may operate as an optical transceiver in any number of environments. For instance, the package structure 100 may be configured to operate as an optical transceiver in fiber media converters. Furthermore, the package structure 100 may be configured to operate at up to 25 Gbit/sec because, on the one hand, the thermally-split leadframe enables the efficient removal of heat from the chips 404 and optical component(s) 308, thereby enabling these devices to operate at greater speeds without failing due to excessive heat conditions. Secondly, because the linear distance between the first major surface (e.g., top surface) of the substrate 104 and the top surface of the chips 404 and/or optical components 308 is minimized thanks to the pocket 112, the length of wire 404 needed to connect the traces 108 and chips 404/optical components 308 is minimized. The minimized wire 404 length reduces the overall noise introduced into the system, thereby enabling the optical transceiver to operate a high speeds without the introduction of too much noise.

Although the top surface of the chips 404 and/or optical component(s) 308 are shown as being slightly elevated (e.g., less than 1 mil higher) as compared to the first major surface of the substrate 104, it should be appreciated that the thickness of the leadframe may be adjusted such that the top surface of the chips 404 and/or optical component(s) 308 may be even with or slightly below (e.g., less than 1 mil lower) than the first major surface of the substrate 104. The thickness of the leadframe sections 204, 208 can be weighed against the thermal dissipation needs and/or desired wire 404 lengths.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A package structure, comprising:
    a substrate comprising a first major surface and an opposing second major surface, the substrate further comprising at least one pocket established therein and having a bottom surface that is positioned between the first major surface and second major surface of the substrate;
    a leadframe configured to fit within the at least one pocket, the leadframe comprising a top surface and a bottom surface, the top surface of the leadframe being exposed via the at least one pocket and the bottom surface of the leadframe interfacing with the bottom surface of the at least one pocket;
    at least one of electrical and optical components mounted to the top surface of the leadframe; and
    one or more wires connecting the at least one of electrical and optical components to one or more traces established on the first major surface of the substrate.

2. The package structure of claim 1, wherein the leadframe comprises a first leadframe section and a second leadframe section separated from the first leadframe section by a thermal gap, wherein a first electrical component is mounted to the first leadframe section and a first optical component is mounted to the second leadframe section.

3. The package structure of claim 2, wherein the first electrical component comprises an Integrated Circuit (IC) chip and wherein the second electrical component comprises at least one of a vertical-cavity surface-emitting laser (VCSEL), a laser diode, a Light Emitting Diode (LED), an array of LEDs, a photodiode, and a photosensor.

4. The package structure of claim 3, wherein the first electrical component further comprises a plurality of IC chips, each of the plurality of IC chips being connected to the one or more traces by the one or more wires.

5. The package structure of claim 4, wherein a distance between the one or more traces and a top surface of the plurality of the IC chips is less than 1 mil.

6. The package structure of claim 1, wherein the substrate comprises a thickness between approximately 1.0 mil and approximately 3.0 mils and wherein the at least one pocket comprise a thickness that is less than approximately 1.0 mil and greater than or equal to approximately 0.7 mils.

7. The package structure of claim 1, wherein the bottom surface of the at least one pocket is substantially flat and configured to interface uniformly with the bottom surface of the leadframe.

8. The package structure of claim 1, wherein the bottom surface of the at least one pocket comprises a strip of metal that is soldered to the bottom surface of the leadframe.

9. The package structure of claim 8, wherein the strip of metal covers less than all of the bottom surface of the at least one pocket.

10. The package structure of claim 1, wherein the bottom surface of the at least one pocket comprises at least one of an epoxy and adhesive that creates an adhesive connection with the bottom surface of the leadframe.

11. A transceiver module, comprising:
    a substrate comprising a first major surface and an opposing second major surface with a pocket established therein;
    a leadframe provided within the pocket and comprising a top surface and a bottom surface, the bottom surface of the leadframe resting upon a bottom surface of the pocket;
    at least one electrical component mounted on the leadframe such that heat generated by the at least one electrical component is carried away from the at least one electrical component by the leadframe, wherein the at least one electrical component includes an Integrated Circuit (IC) chip that is mounted to a first leadframe section of the leadframe; and
    at least one optical component mounted on the leadframe such that heat generated by the at least one optical component is carried away from the at least one optical component by the leadframe, wherein the at least one optical component includes at least one of a vertical-cavity surface-emitting laser (VCSEL), a laser diode, a Light Emitting Diode (LED), an array of LEDs, a photodiode, and a photosensor that is mounted to a second leadframe section of the leadframe, and wherein a gap is provided between the first leadframe section and the second leadframe section.

12. The transceiver module of claim 11, wherein heat dissipated by the first leadframe section only corresponds to heat generated by the at least one electrical component and wherein heat dissipated by the second leadframe section only corresponds to heat generated by the at least one optical component.

13. The transceiver module of claim 11, wherein the bottom surface of the pocket is substantially flat and configured to interface with the bottom surface of the leadframe.

14. The transceiver module of claim 11, wherein the bottom surface of the pocket includes at least one piece of metal that establishes a connection with the leadframe.

15. The transceiver module of claim 11, wherein a thickness of the substrate is greater than a depth of the pocket.

16. A transceiver module, comprising:
    a substrate comprising a first major surface and an opposing second major surface with a pocket established therein;
    a leadframe provided within the pocket and comprising a top surface and a bottom surface, the bottom surface of the leadframe resting upon a bottom surface of the pocket;
    at least one electrical component mounted on the leadframe such that heat generated by the at least one electrical component is carried away from the at least one electrical component by the leadframe; and
    at least one optical component mounted on the leadframe such that heat generated by the at least one optical component is carried away from the at least one optical component by the leadframe, wherein the bottom surface of the pocket includes at least one of an epoxy and adhesive that couples the bottom surface of the substrate to the bottom surface of the leadframe.

17. An optical transceiver system, comprising:
- an optical component configured to at least one of receive and transmit light in connection with communications transmitted over a fiber optic network;
- one or more Integrated Circuit (IC) chips configured to process one or more signals received from or transmitted to the optical component in connection with facilitating the communications;
- a thermally-split leadframe comprising a first section and a second section with a gap established therebetween, the first section having the one or more IC chips mounted thereto, the second section having the optical component mounted thereto; and
- a substrate having a pocket established therein that is configured to support and receive the thermally-split leadframe such that a bottom surface of the thermally-split leadframe is positioned between a first major surface and a second major surface of the substrate.

18. The system of claim 17, wherein the pocket comprises a recess in the substrate that does not extend completely from the first major surface of the substrate to the second major surface of the thermally-split leadframe, wherein the pocket comprises a bottom surface that interfaces with the bottom surface of the thermally-split leadframe.

19. The system of claim 18, wherein the bottom surface of the pocket comprises at least one of a metal that is soldered to the bottom surface of the thermally-split leadframe, an adhesive, and an epoxy.

20. The system of claim 18, wherein the bottom surface of the pocket is substantially flat.

* * * * *